United States Patent [19]
Ameen et al.

[11] Patent Number: 5,211,328
[45] Date of Patent: May 18, 1993

[54] METHOD OF APPLYING SOLDER

[75] Inventors: Joseph G. Ameen, Apalachin; Joseph Funari, Vestal; Ronald J. Moore, Binghamton, all of N.Y.

[73] Assignee: International Business Machines, Armonk, N.Y.

[21] Appl. No.: 886,895

[22] Filed: May 22, 1992

[51] Int. Cl.⁵ .................... B23K 1/20; H01L 21/60
[52] U.S. Cl. ........................ 228/180.2; 228/219; 427/96; 427/266
[58] Field of Search ............. 228/180.2, 219; 427/96, 427/282, 287, 123, 266; 118/412

[56] References Cited

U.S. PATENT DOCUMENTS

| | | | |
|---|---|---|---|
| 3,516,155 | 6/1970 | Smith | 428/159 |
| 3,583,063 | 8/1971 | Growney | 228/180.1 |
| 4,311,267 | 1/1982 | Lim | 228/180.2 |
| 4,382,255 | 5/1982 | Bickford et al. | 228/254 |
| 4,412,642 | 11/1983 | Fisher, Jr. | 228/173.1 |
| 4,684,055 | 8/1987 | Baer et al. | 228/180.1 |
| 4,722,470 | 2/1988 | Johary | 228/180.2 |
| 4,759,491 | 7/1988 | Fisher | 228/180.2 |
| 4,842,184 | 6/1989 | Miller, Jr. | |
| 4,872,261 | 10/1989 | Sanyal et al. | |
| 4,898,320 | 2/1990 | Dunaway et al. | |
| 4,898,320 | 2/1990 | Dunaway et al. | 228/245 |
| 4,906,823 | 3/1990 | Kushima et al. | 228/246 |
| 4,998,342 | 3/1991 | Bonnell et al. | 228/180.2 X |
| 5,001,829 | 3/1991 | Schelhorn | 29/840 X |
| 5,048,747 | 9/1991 | Clark et al. | 228/180.2 |
| 5,076,487 | 12/1991 | Bandyopadhyay | 228/219 |

FOREIGN PATENT DOCUMENTS 59-19066 1/1984 Japan.
1-241776 9/1989 Japan.

OTHER PUBLICATIONS

IBM Technical Disclosure Bulletin vol. 19, No. 8, Jan. 1977, "Tinning Preplated Sites On A Substrate", by Herdzik et al.
IBM Technical Disclosure Bulletin vol. 28, No. 2, Jul. 1985, "Method For Applying Solder Paste On Non-Planar Boards", by Curtis et al.
Insulation/Circuits, vol. 26, No. 11, pp. 51–52, "New Concept Involving Solder Flowing Through Precisely Placed Holes in Plastic Film Useful for High Density Connections".
Soldering Manual American Welding Society, Inc. Miami, Florida (1977) p. 131.

Primary Examiner—Kenneth J. Ramsey
Attorney, Agent, or Firm—Lawrence R. Fraley

[57] ABSTRACT

A method of precisely depositing accurately defined quantities of solder onto high density circuit patterns on a substrate without use of a solder mask or the like wherein solder paste is originally deposited within a precisely defined transfer member (e.g., graphite block having holes drilled therein), the transfer member then being aligned relative to the respective circuitry such that when both block and substrate are heated, solder flow and deposition will occur without the use of a solder mask or the like. Following deposition, a second circuit member (e.g., flexible circuit) may be electrically coupled to the substrate's conductors, the deposited solder providing the coupling medium. Hydrogen gas may be used during the heating of the paste and also during the soldering of the flexible circuit to the substrate.

20 Claims, 3 Drawing Sheets

METHOD OF APPLYING SOLDER

TECHNICAL FIELD

The invention relates to methods for applying solder material and more particularly to methods for applying precise amounts of solder to microminiature circuit sites (e.g., conductor pads or lines) on a substrate.

BACKGROUND OF THE INVENTION

Precise solder application onto microminiature circuit sites is considered extremely important in the manufacture of various microelectronic devices such as those used in the information handling (computer) field. Miniaturization of circuitry is, understandably, highly desired in the computer industry. Devices using such circuitry include flexible circuit members (e.g., tape automated bonded (TAB) packages), circuitized ceramic substrates, printed circuit boards, etc. Interconnection between these devices (e.g., flexible circuits and printed circuit boards) is preferably accomplished using solder material as the coupling medium. Heretofore, one known technique for applying solder onto such devices has been to use a screening process. Such a process may, however, present various problems, such as non-uniformity of solder amount application per site (e.g., lands), "solder bridges" occurring between adjacent lands causing electrical shorting therebetween in final operation, etc. Various examples of solder application procedures are described in U.S. Pat. Nos. 4,872,261 (Sanyal et al), 4,832,255 (Bickford et al), 4,684,055 (Baer et al) and 4,311,267 (Lim). In another patent, 5,048,747 (Clark et al), solder transfer is accomplished using a "shuttle" having solder therein in combination with a solder mask, the latter deemed necessary to retain the solder during deposition (to prevent undesirable bridging).

The present invention represents an improvement over known solder application processes, including those described in the above patents, by providing a heatable transfer member with precisely defined (e.g., drilled) holes therein into which solder paste is deposited. The transfer member, with solder, is precisely aligned relative to respective circuitry on a substrate (e.g., ceramic) and heated to a predetermined temperature sufficient to effect solder reflow onto the substrate's metallic sites (circuitry). Precise solder amount per site application is assured due to the initial accurate volume determination of the transfer member's holes. Ease of paste filling (into the transfer member) is also assured. Significantly, such precise solder deposition is attained without use of a solder mask or the like.

It is believed that such an improved method would constitute a significant advancement in the art.

DISCLOSURE OF THE INVENTION

It is, therefore, a primary object of the present invention to enhance the art of solder application onto various substrates.

It is another object of the invention to provide such a method wherein precisely determined amounts of such solder will be dispensed in a facile manner onto respective metallic sites (e.g., conductors) of such substrates.

In accordance with one aspect of the invention, there is provided a method of applying solder to metallic sites of a substrate which comprises the steps of providing a transfer member having a plurality of holes therein, selected ones of the holes having a predetermined volume, substantially filling selected ones of the holes with solder paste, positioning the transfer member having selected ones of the holes substantially filled with solder paste in aligned relationship relative to (e.g., above) the substrate such that selected ones of the holes having solder paste therein are aligned with respective metallic sites, heating the transfer member to a predetermined temperature to cause the solder paste within the holes to flow onto the metallic sites, and cooling the flowed solder on the metallic sites such that the solder solidifies.

BEST MODE FOR CARRYING OUT THE INVENTION

For a better understanding of the invention, together with other and further objects, advantages, and capabilities thereof, reference is made to the following disclosure and appended claims in connection with the above-described drawings.

Figure 1:
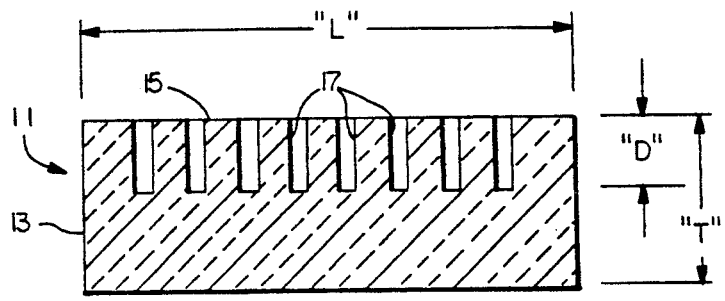
FIG. 1 is a side elevational view, in section, of a transfer member in accordance with one embodiment of the invention.

In FIG. 1, there is shown a transfer member 11 in accordance with one embodiment of the invention. Transfer member 11, as defined herein, represents a critical element in the method as defined herein for applying precisely determined amounts of solder material onto respective metallic sites (e.g., conductors) of a substrate. Such precise application, as mentioned above, is deemed extremely important in the microminiature circuit art, and particularly for those circuits used in computers. Transfer member 11 preferably comprises a substantially rectangular block 13 having a thickness (dimension "T") of about 0.250 inch and an overall length (dimension "L") of about 1.750 inch. This block is preferably box-like in shape and thus the upper surface 15 thereof is also preferably rectangular (when viewed from the top in FIG. 1). Such a rectangular surface 15, in one embodiment of the invention, possesses side dimensions of 1.750 inch (the same as the aforementioned length dimension ("L"), by 1.750 inch. Other sizes are readily possible, depending on the substrate being soldered.

Transfer member 11 is preferably of graphite, a preferred material available from Poco Graphite, Inc., Decatur, Tex. under the product name DFP-1C. Such a material, significantly, possesses an extremely high melting point (e.g., in excess of 3500 degrees Celcius) and equally significant, is non-wettable (to solder adhesion during solder reflow and eventual solidification). Alternative materials for member 11 include ceramic (a preferred ceramic material available under the product name Macor (a machineable glass ceramic) from Corning Glass Works, Corning, N.Y.). Graphite is especially preferred when depositing solder onto substrates comprised substantially of ceramic as the dielectric due to the substantial similarity between the coefficients of thermal expansion thereof. Such similarity greatly enhances precise deposition in the highly dense patterns defined herein because the two structures (substrate and transfer member) will contract and expand at substantially similar rates, thus assuring critical alignment between the various elements (holes, metallic sites) thereof. All of the above materials assure effective solder flow (described in greater detail below) during heating thereof to the temperatures defined herein. Such solder flow, understandably, represents a critical aspect of the present invention.

Transfer member 11, as shown in FIG. 1, includes a plurality of holes 17 located within top surface 15 thereof. Holes 17, as shown, occupy a predetermined depth (below) within member 11 and do not extend entirely through the member. In a box-like, graphite transfer member possessing dimensions as described above, a total of about 7,300 holes 17, each of 0.010 inch diameter and spaced at 0.010 inch intervals, may be provided within the block's top surface (15) for subsequent alignment with a corresponding substrate upon which solder from the block will be deposited. The invention is not, of course, limited to such a number of holes, as it is to be understood that the block 13 of the invention may include any number of holes or other openings (e.g., elongated slots) therein designed for the purpose of accommodating respective quantities of solder paste therein. More specifically, such a graphite transfer member 11 will include an identical pattern of openings (including those of cylindrical or other configuration) therein which matches the corresponding pattern of the substrate circuitry (see below) upon which solder is to be deposited. Significantly, it is noted that such a relatively large number of holes are provided in a relatively small overall area (e.g., about 3.06 square inches) to thus provide a highly dense pattern of such holes. In the above example, a pattern of about 2,380 holes per square inch is provided.

Holes 17 are preferably provided within block 13 by drilling, which holes in one embodiment of the invention occupy a depth (dimension "D") of about 0.030 inch. Each hole is preferably cylindrical and includes a diameter ("d", FIG. 2) of about 0.040 inch. As stated, the invention is not to be limited to cylindrical holes but instead is broad enough in scope to include holes of other configurations, including rectangular and octagonal (in cross-section), etc. By the term hole as used herein is thus meant to define cylindrical, rectangular and other shaped openings (when viewed from above surface 15) as well as those of elongated configuration (also when viewed from above surface 15) such as those which may also be referred to as slots, channels, troughs, etc. Each of the holes 17 as described above possesses a total volume of about $3.77 \times 10^{-5}$ cubic inches, to in turn accommodate a similar volume of solder paste therein, which quantity of paste is deemed sufficient to cover the metallic sites described below. Again, the invention is not to be limited to these amounts as other amounts are possible, depending on the metallic sites receiving this material.

Figure 2:
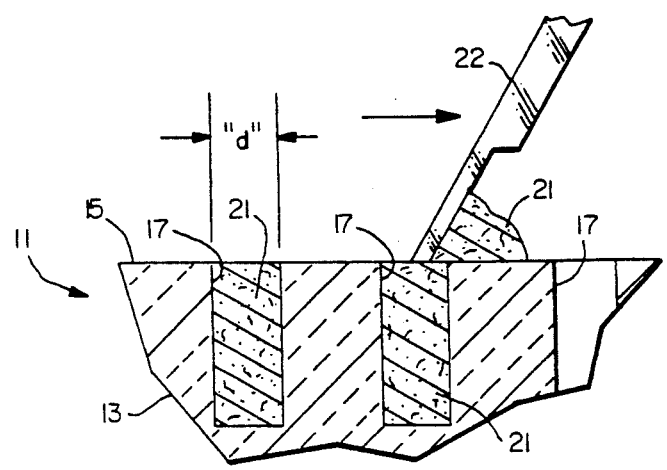
FIG. 2 is a partial view, in section and on an enlarged scale over the view in FIG. 1, of the transfer member of FIG. 1 with solder paste being positioned therein.

As shown in FIG. 2, solder paste 21 can be readily deposited within selected ones of the transfer member's holes 17 using a screening operation or the like. Solder paste screening operations are well known in the electronics industry (see, e.g., "Principles of Electronic Packaging", Donald P. Seraphim et al., 1989, pages 609 and 610, and, particularly, "Microelectronics Packaging Handbook", Rao R. Tummala et al., 1989, pages 828 and 829) and further description in thus not believed necessary. A doctor blade 22 may be used to dispense the solder during a sweeping motion (indicated by the directional arrow in FIG. 2) across the transfer member's upper surface 15. Other methods may be utilized to fill the respective holes 17 with solder, including microdispensing, squeegee (of liquified solder) and solder ball placement (wherein individual, microminiature solder balls are aligned and placed within the respective holes). Solder 21 is preferably applied with the transfer member 11 in the upright position (holes 17 facing upwardly) depicted in FIGS. 1 and 2. This also is not meant to limit the invention as the block may be oriented in other directions, depending on the various apparatus used for this purpose.

A preferred solder paste composition includes 10:90 tin:lead solder wherein tin comprises about 10% by weight of the solder portion with lead constituting substantially 90% of the solder portion. This solder portion is also preferably combined with a suitable organic binder (e.g., glycerin or ethylene glycol) to produce a composition substantially free of flux. Various solder pastes of this or similar composition may be used, including those commercially available on the market today. Examples include those available from Alpha Metals, Inc. under the product names RMA384 and 321. A solder creme, also available from Alpha Metals, Inc., under the product name 10/90R-A8050, may also be used. These compositions, however, include flux and are thus not as preferred as the above 10:90 solder composition. Other solders are readily usable in the present invention including, for example, 63:37 tin:lead solder and 5:95 tin:lead solder, in combination with an organic binder (several kinds of which are known in the art). The described 10:90 tin:lead solder paste composition possesses a melting point of from between about 285 degrees Celsius (C) and 290 degrees C.

Figure 3:
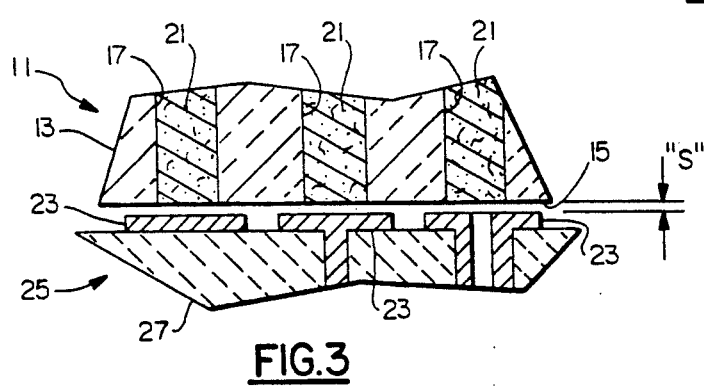
FIG. 3 is a partial view, in section, showing the transfer member of the invention aligned above metallic sites (conductors) on a substrate.

With paste 21 in position, block 13 is inverted (holes facing down) and aligned, precisely, with corresponding metallic sites 23, as shown in FIG. 3. Such inversion may be achieved using a robotic arm 24 (FIG. 8), described in greater detail below. Sites 23, as understood from the foregoing, are preferably metallic (e.g., copper) conductors which may be in the form of flat pads, conductive pins, or conductive plated-through-holes located on/within a substrate 25 and which may be utilized as part of the electrical circuitry thereof. All three of the above types of sites are shown in FIG. 3, for illustration purposes.

Alternatively, metallic sites 23 may be in the form of solder paste lines or metal-filled organic paste lines.

Such lines are also known in the art as thick film conductor lines and are formed from various paste compositions (e.g., silver-palladium, silver-palladium-gold, copper) which are commercially available. These are applied (e.g., screened) onto the respective substrate and thereafter fired to achieve solidification thereof.

Figure 4:
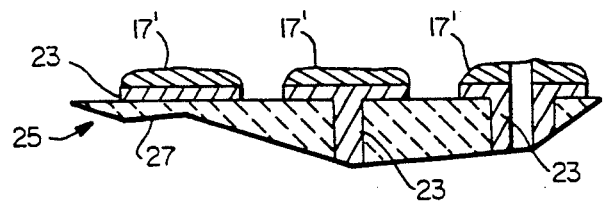
FIG. 4 shows the results of the solder flow from the aligned transfer member and substrate shown in FIG. 3, the solder having solidified at this stage.

Should a surface conductor pad (to the left in FIG. 3) be the desired solder recipient, this pad may in turn be electrically coupled to a circuit line (not shown) or the like, as is typically known. Should the site be a metallic pin (shown in the center in FIG. 3), this pin may extend within the dielectric material 27 (e.g., ceramic) of the substrate (e.g., to be electrically coupled to internal circuitry (e.g., signal/power planes) located therein). Should the metallic site be a plated-through-hole (shown to the right in FIG. 3), this conductive hole may also be electrically coupled to internal signal/power planes, as is known in the art. Both pin and hole embodiments may also be coupled to circuitry on the substrate's upper surface, if desired. Should a plated-through-hole be used, it is important that the surface tension of the volume of solder applied onto the land thereof be greater than the gravitational force (assuming an upright orientation as shown in FIGS. 3 and 4) on the solder, which force may otherwise tend to draw the solder through the hole. Accordingly, a relatively small hole, in comparison to the overall size of the respective land segment, is preferred.

Regardless of the configuration for the receiving metallic sites, the invention is able to provide precise solder deposition on the upper surfaces thereof in accordance with the unique teachings of the present invention.

With transfer member 11 aligned with substrate 25 as shown in FIG. 3, both the transfer member and receiving substrate are heated to a predetermined temperature sufficient to cause flow of solder 17 onto the respective upper surfaces of sites 23. In a preferred embodiment of the invention, such heating was accomplished by placing the transfer member and substrate in a hydrogen furnace heated to a temperature of about 350 degrees C. (greater than the melting point of the solder paste) for a time period of about two to three minutes. The heated solder flows as a result of this heating onto the respective top surfaces of each aligned metallic site 23 to the approximate shape illustrated in FIG. 4. Once this flowing had occurred, the substrate is removed and allowed to cool, whereupon the flowed solder will solidify (as shown in FIG. 4 and represented by the numeral 17').

Significantly, use of hot hydrogen gas at this stage results in substantial removal of metal oxides associated with many soldering operations. The present invention is thus uniquely capable of being implemented without use of solders of the flux-activated variety.

The preferred spacing (dimension "S" in FIG. 3) between the surface 15 of block 13 having solder paste 21 therein and the upper surface of the respective metallic sites 23 is only about 0.015 inch (but may be less), when block 13 includes holes 17 and the defined quantities of solder paste therein for being deposited on metallic sites as described above. Such sites, if pads (as described above) are preferably of a thickness of about 0.0003 inch to about 0.001 inch and may be either round or rectangular in configuration. If round, these may possess a diameter of from about 0.005 inch to about 0.025 inch, while, if rectangular, may possess side dimensions of 0.010 inch and 0.020 inch, respectively. If conductive pins, preferably these sites include a round upper surface having a thickness of 0.015 inch and a diameter of from about 0.020 inch to about 0.022 inch. If plated-through-holes, these preferably possess an overall outer diameter for the land portion which is substantially larger than the corresponding internal opening, for the reasons cited above. Significantly, solder deposition is achieved without requiring physical contact between paste and receiving site elements. Such a spaced relationship during solder flow is considered even more significant when considering the ability of the invention to apply solder to misaligned (intentionally or not) sites, as described further below (FIGS. 5, 6).

The described metallic sites, if conductor pads, may be as closely spaced as about 0.010 inch (center to center), thus illustrating the relatively high density of sites capable of receiving solder in accordance with the teachings herein. Should metallic sites 23 be in the form of circuit lines (e.g., having a width of about 0.002 inch), these lines may be spaced as close as only about 0.002 inch apart, thus further illustrating the high density patterns capable of receiving solder in accordance with the teachings herein.

Although a temperature of about 350 degrees C. has been described as the temperature to which block 13 and substrate 25 are heated, this temperature may range from about 300 degrees C. to about 400 degrees C. for the solder composition described hereinabove. This temperature must, of course, exceed the solder's melting point.

Figure 5:
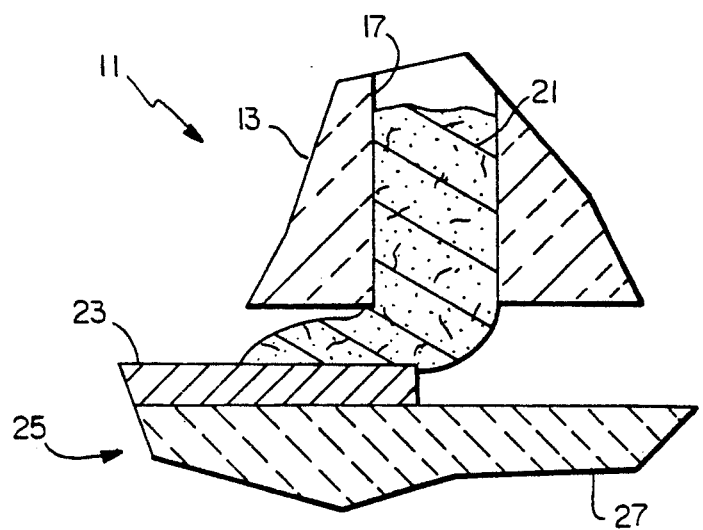
FIGS. 5 and 6 illustrate solder application from a transfer member of the invention when the member's solder-filled holes are misaligned with respect to the solder-receiving metallic sites, thus indicating the ability of the invention to compensate for such possible misalignment during solder flow.
Figure 6:
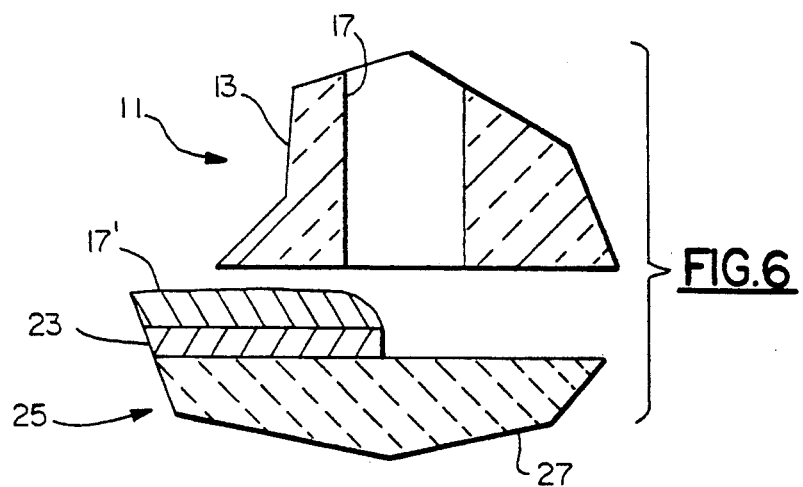

In FIGS. 5 and 6, it is shown that the invention is capable of depositing solder 21 onto a metallic site 23 despite possible misalignment (intentional or not) between the respective site and the hole 17 containing the paste 21 to be deposited. The invention is thus uniquely able to provide solder deposition during periods of slight misalignment, said capability deemed to constitute a significantly advantageous feature of the present invention, considering the high density patterns of solder deposition being provided herein. Solder flow onto the respective sites, as seen in comparing FIG. 5 and FIG. 6, is achieved due to the ability of the solder to "wick" across the top surface of the respective metallic site so as to substantially cover same. Once so positioned, the deposited solder is allowed to cool to the point of solidification (FIG. 6). The total extent of such misalignment compensation depends, of course, on the various dimensions of the sites receiving solder. For example, a misalignment of up to about 0.0015 inch is tolerated for site spacings of about 0.010 inch.

Figure 7:
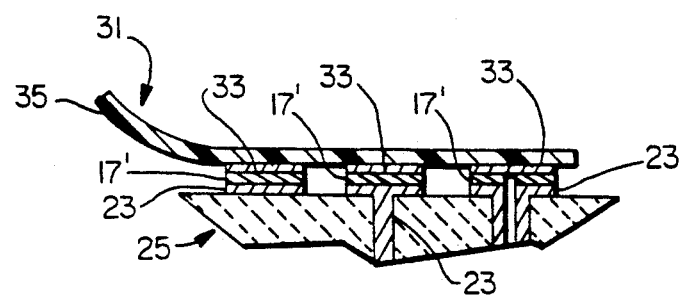
FIG. 7 shows a flexible circuit coupled, electrically, to the substrate in FIGS. 3 and 4.

In FIG. 7, substrate 25, having solder covered metallic sites thereon, may be electrically coupled to another circuit member 31 such that conductors 33 thereon (which may form part of the circuitry of the circuit member 31) are electrically coupled to respective ones of the metallic sites (conductors) 23. In a preferred embodiment, circuit member 31 comprises a thin, flexible circuit having a dielectric (e.g., polyimide) layer 35 on which are located metallic (e.g., copper) conductors 33. Such conductors may be positioned using known techniques (e.g., photolithographic) in the art. To complete coupling, the aligned conductors 33 and respective metallic sites 23 are held in alignment and the flexible circuit and substrate heated (preferably also within a hydrogen furnace using hot hydrogen gas to derive the benefits mentioned above, e.g., oxide removal) to a pre-established temperature sufficient to cause reflow of the solidified solder 17' which, as shown in FIG. 7, is physically located between these respective pairs of conductors. In a preferred embodiment of the invention, a flexible circuit and substrate were heated by hot hydrogen gas to a temperature of from about 325 degrees C. to about 350 degrees C., sufficient to cause solder reflow.

In a preferred embodiment of the invention, substrate 25 included the aforementioned ceramic as the substrate's dielectric material and, in one embodiment, possessed an overall thickness of only about 0.250 inch. This is not meant to limit the invention, however, in that other substrate dielectrics, including, for example, the well known fiberglass-reinforced epoxy resin (a/k/a FR4 material) may be utilized. It is further understood that circuit members other than flexible circuits (as shown in FIG. 7) may be electrically coupled to the respective sites on substrate 25, one example of such an alternative circuit member being a known printed circuit board (e.g., one of the aforementioned FR4 dielectric having one or more individual conductive layers as part thereof).

Figure 8:
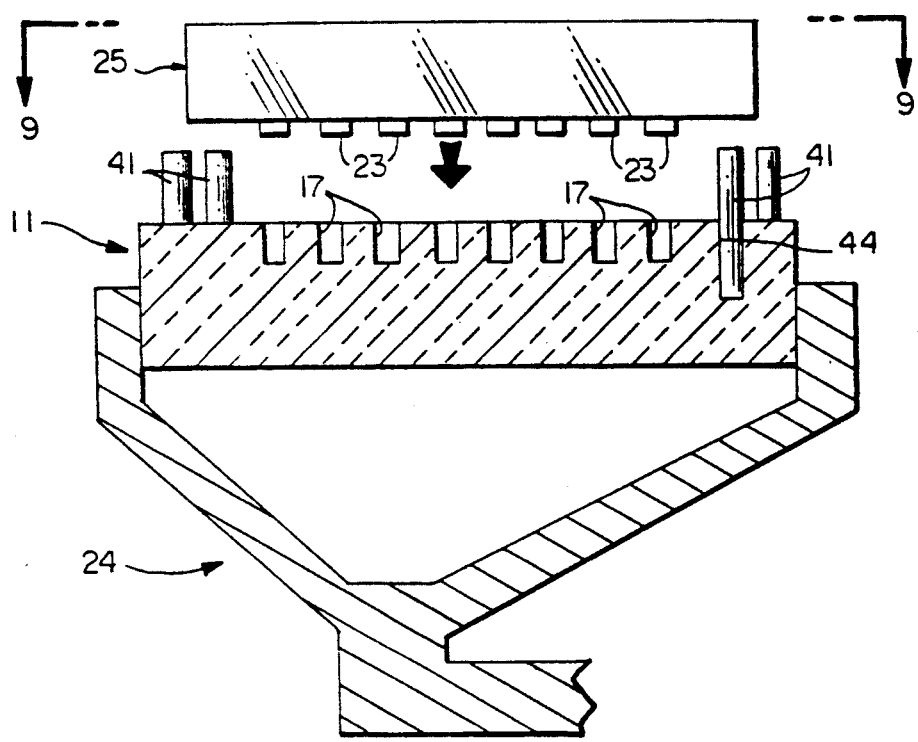
FIG. 8 illustrates a side elevational view, in section, of a device (e.g., robotic arm) which may be used to hold the transfer member of the invention so that the transfer member may be precisely aligned relative to a substrate, one example of such an alignment means also shown in FIG. 8.
Figure 9:
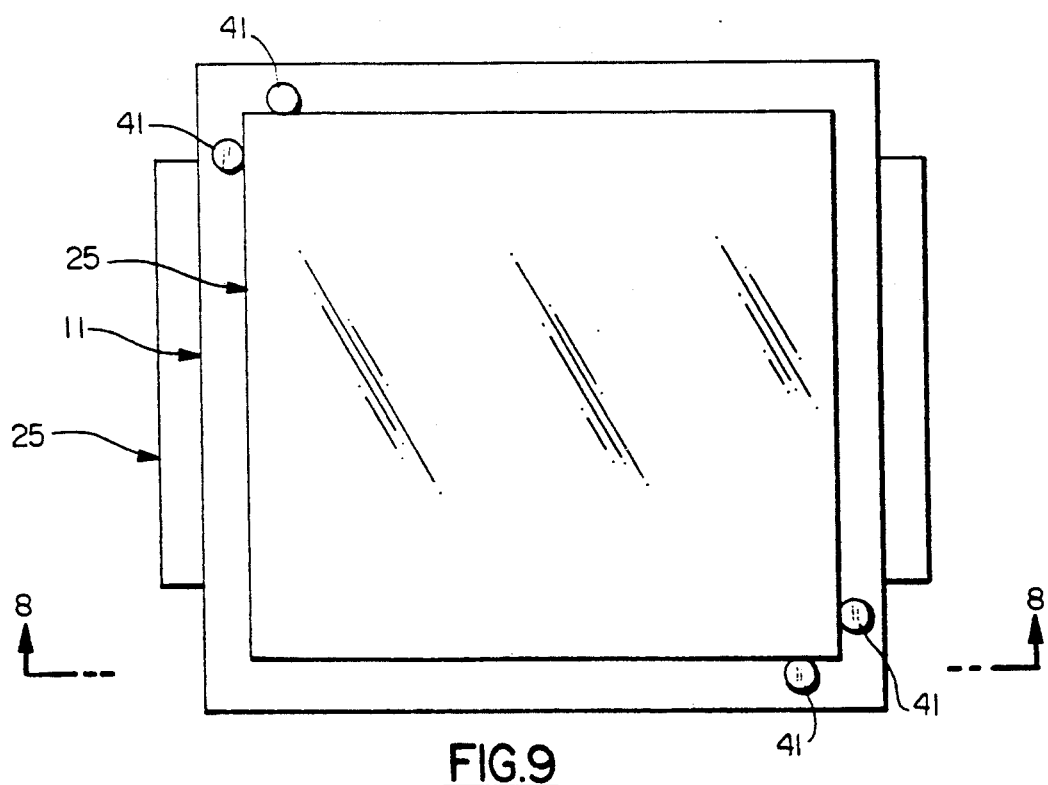
FIG. 9 is a plan view as taken along the line 9—9 in FIG. 8.

In FIGS. 8 and 9 are represented apparatus (e.g., the aforementioned robotic arm 24) designed to facilitate alignment and positioning of the transfer member 11 and solder-receiving substrate relative to each other in accordance with a preferred embodiment of the invention. Arm 24, robotic in nature, grasps the transfer member 11 to hold same in the orientation (holes 17 facing up) shown in FIG. 8. Holes 17 are then filled with solder paste (not shown in FIG. 8 for ease of illustration), using, preferably, the aforementioned doctor blade 22 (FIG. 2). As stated, member 11 may now be inverted or, alternatively, maintained in the upright orientation in FIG. 8, whereupon a substrate (e.g., a ceramic substrate 25 having several conductive sites 23 thereon) is aligned with respect thereto. Member 11 and substrate 25 are then brought into close proximity, e.g., by lowering the substrate in FIG. 8 or, alternatively (if member 11 is held inverted) by lowering the transfer member. Precise alignment is assured using pairs of aligning pins 41 located at opposing corners (along the transfer member's diagonal) of the transfer member, each pair designed for slidably engaging an opposite corner of substrate 25. Only two pairs of such pins 41 are deemed necessary to accomplish this. Pins 41 are preferably stainless steel and held in corresponding openings 44 (only one shown in FIG. 8) within member 11 by friction or suitable cement.

There has thus been shown and described a method of precisely depositing amounts of solder onto respective circuit patterns on a substrate wherein such patterns may be of high density concentration. Of importance, such precise solder deposition is achieved without use of a solder mask or the like, such as described (and required) in U.S. Pat. No. 5,048,747. Such precise deposition enables exactly determined amounts of solder to be deposited per metallic site of the pattern, as is considered critical (e.g., to prevent solder "bridging"). The method as defined herein can be accomplished in a relatively facile manner, using known materials currently available. Significantly, the invention is especially suited for depositing solder on ceramic substrates having circuitry on the upper surfaces therein. Subjecting such substrates to other soldering techniques (e.g., wave or dip soldering) may cause cracking of the ceramic, if of the thickness mentioned herein. Screening solder onto such material is also considered unacceptable for high density applications as defined herein due to possible tolerance problems with such a ceramic, if of a multilayered configuration (e.g., due to shrinkage).

Use of graphite material for a solder transfer member as defined herein is also considered particularly advantageous when applying solder to ceramic substrates because of the similar coefficient of thermal expansion of this material to such ceramics, for the reasons stated above.

While there have been shown and described what are at present considered the preferred embodiments of the invention, it will be obvious to those skilled in the art that various changes and modifications may be made therein without departing from the scope of the invention as defined by the appended claims.

What is claimed is:

1. A method of applying solder to metallic sites on a substrate, said method comprising:
   providing a transfer member having a plurality of holes therein, selected ones of said holes having a predetermined volume;
   substantially filling said selected ones of said holes with solder paste;
   positioning said transfer member having said selected ones of said holes substantially filled with said solder paste in aligned orientation relative to a substrate having a plurality of metallic sites thereon such that said selected ones of said holes having said solder paste therein are aligned with said metallic sites;
   heating said transfer member to a predetermined temperature to cause said solder paste within said holes to become molten and flow onto said metallic sites; and
   cooling said flowed solder on said metallic sites such that said solder solidifies, said method being accomplished without the use of a solder mask or the like.

2. The method of claim 1 wherein said filling of said selected ones of said holes with said solder paste is accomplished using a screening operation.

3. The method of claim 1 wherein said transfer member is positioned with said selected ones of said holes facing substantially upward during said filling of said holes with said solder paste and thereafter substantially inverted during said heating of said transfer member such that said selected ones of said holes are located substantially above said metallic sites during said heating.

4. The method of claim 1 wherein said predetermined temperature is within the range of from about 300 degrees Celsius to about 400 degrees Celsius.

5. The method of claim 4 wherein said solder paste comprises a 10:90 tin:lead solder composition.

6. The method of claim 1 wherein said metallic sites comprise metallic pad elements.

7. The method of claim 6 wherein said metallic sites are comprised of copper.

8. The method of claim 1 wherein said metallic sites comprise thick film conductors.

9. The method of claim 1 wherein said selected ones of said holes are of substantially cylindrical configuration.

10. The method of claim 1 wherein said substrate includes a dielectric material comprised of ceramic.

11. The method of claim 1 wherein the coefficients of thermal expansion of said transfer member and said substrate are substantially similar.

12. The method of claim 11 wherein said transfer member is comprised of a material selected from the group consisting essentially of graphite, ceramic and titanium.

13. The method of claim 1 wherein said heating of said transfer member is accomplished using hydrogen gas.

14. The method of claim 13 wherein said solder paste is free of flux.

15. The method of claim 1 further including electrically coupling a flexible circuit to said metallic sites on said substrate after said solder has been solidified.

16. The method of claim 15 wherein said flexible circuit includes a plurality of conductors, selected ones of said conductors being electrically coupled to respective ones of said metallic sites having said solidified solder thereon.

17. The method of claim 16 wherein said electrical coupling of said flexible circuit to said metallic sites on said substrate is accomplished by heating said flexible circuit and said substrate to a pre-established temperature sufficient to reflow said solidified solder.

18. The method of claim 17 wherein said pre-established temperature sufficient to reflow said solidified solder is from about 325 degrees Celsius to about 350 degrees Celsius.

19. The method of claim 17 wherein said heating of said flexible circuit and said substrate is accomplished using hydrogen gas.

20. The method of claim 1 wherein said selected ones of said holes filled with said solder paste are aligned relative to said substrate at a spaced distance from said metallic sites.

* * * * *